United States Patent [19]

Giordanino

[11] Patent Number: 4,811,157

[45] Date of Patent: Mar. 7, 1989

[54] ELECTROMAGNETIC RELAY WITH LIGHT SIGNALING DEVICE

[75] Inventor: Piero Giordanino, Almese, Italy

[73] Assignee: Rele' Finder S.p.A., Turin, Italy

[21] Appl. No.: 144,513

[22] Filed: Jan. 15, 1988

[30] Foreign Application Priority Data

Sep. 25, 1987 [IT] Italy .............................. 67811 A/87

[51] Int. Cl.⁴ ......................... H05K 1/14; H05K 5/00; H01H 50/12

[52] U.S. Cl. .................................... 361/142; 361/395; 361/399

[58] Field of Search ....................... 361/142, 395, 399; 335/17

[56] References Cited

U.S. PATENT DOCUMENTS 4,246,621 1/1981 Tsukioka ............................ 361/159
4,728,914 3/1988 Morris et al. ....................... 361/395

*Primary Examiner*—L. T. Hix
*Assistant Examiner*—David Porterfield
*Attorney, Agent, or Firm*—Renner, Otto, Boisselle & Sklar

[57] ABSTRACT

An electromagnetic relay provided with a light signaling device and comprising a support on which a base is fixed for a printed circuit carrying a LED and a resistor. A pair of conductors connect the printed circuit to a coil of attraction of the relay.

8 Claims, 2 Drawing Sheets

ELECTROMAGNETIC RELAY WITH LIGHT SIGNALING DEVICE

BACKGROUND OF THE INVENTION

This invention relates to an electromagnetic relay provided with a light signaling device.

Signaling devices are known that are connected to electromagnetic relays to indicate whether the relay is switched on or off, such devices being constituted by light indicated elements such as incandescent lamps, neon lamps or other similar lighting elements.

As these devices normally are of considerable dimensions in comparison with the relatively small dimensions of the relay with which they are associated, they cannot be accommodated in the interior of the space defined by the casing of the relay and usually are arranged in positions that may be located at a considerable distance from the place where the relay is located and operates.

An example of the use of such light signalers is given by the industry for the construction of electrotechnical and electronical equipment where such light indicators are mounted on movable panels forming part of structures containing electrical apparatus, in particular relays, designed for the actuation of working machines operating in predetermined and precise sequential cycles.

Such indicators sometimes may cause confusion and difficulties in recognizing the relay connected thereto, even to expert operators, because of the considerable distance between the two elements.

It is an object of the present invention to eliminate or reduce the drawbacks and disadvantages of the electromagnetic relays provided with light signaling means as hitherto adopted and to provide a light signaling device that can be easily and conveniently inserted in the interior of the space defined by the dimensions of the box for protecting and containing the relay, and that without modifying the standard dimensions of the relays at present constructed.

Further objects of the present invention consist in providing a device that can be easily constructed, is reliable in operation, of contained cost and considerable simplicity in mounting and connection to the relay.

SUMMARY OF THE INVENTION

These and other objects and advantages, which will become apparent from the following description, are achieved according to the invention by an electromagnetic relay provided with a light signaling device. The light signaling device comprises an appropriately shaped support of heat molded plastics material, adapted to receive and retain, on a plane surface thereof, a base for a printed circuit to the conducting paths of which a LED and a resistor are connected. A pair of conductors for feeding current to the printed circuit are connected in parallel to the coil of attraction of the electromagnetic relay.

DESCRIPTION OF PREFERRED EMBODIMENTS

Figure 1:
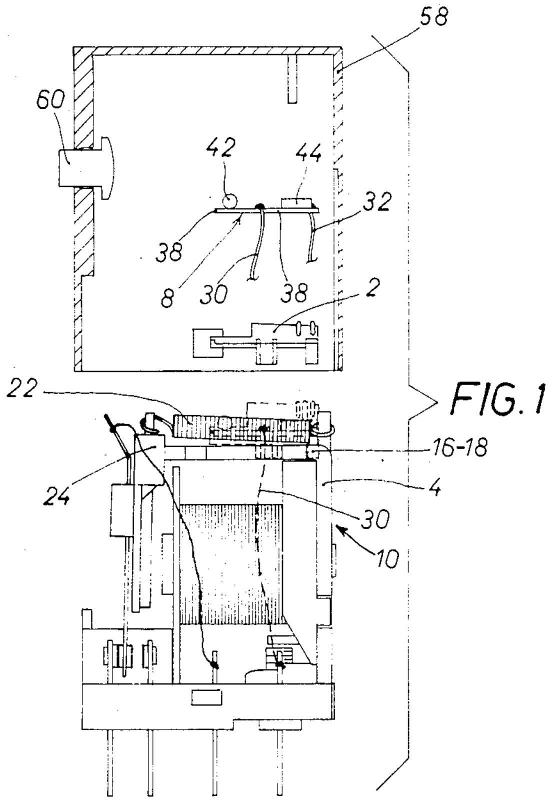
FIG. 1 is an elevational view, partly in section, of a relay whose components constituting the invention are shown in an exploded view.
Figure 2:
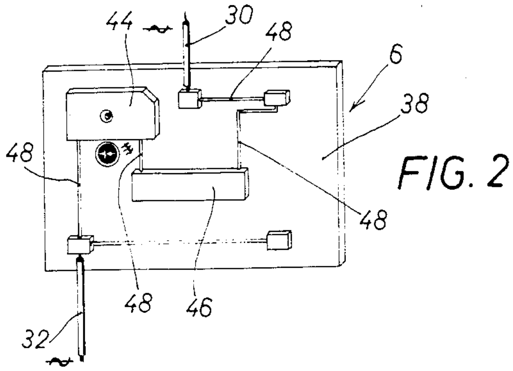
FIG. 2 is a perspective view of a printed circuit according to the invention, adapted to be used in a relay fed by alternating current.
Figure 3:
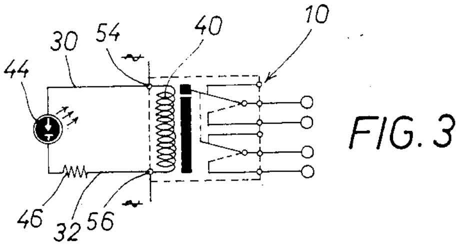
FIG. 3 shows the electric circuit equivalent to the printed circuit of FIG. 2, but connected to an electromagnetic relay.
Figure 5:
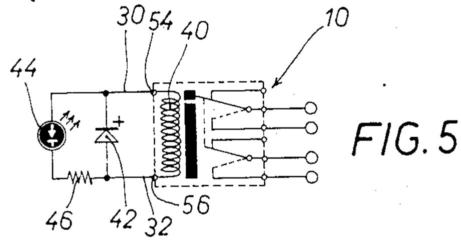
FIG. 5 shows the electric circuit equivalent to the printed circuit of FIG. 4, but connected to an electromagnetic relay.

Referring to FIG. 1, a light signaling device according to the invention comprises a support 2 for a printed circuit 6 shown in FIG. 2, the support being made of molded thermoplastics material and inserted in and interlockingly secured to the upper portion of a fixed standard 4 of soft iron forming part of the magnetic attraction circuit of an electromagnetic relay 10 shown in FIG. 1 and diagrammatically in FIGS. 3 and 5.

Figure 6:
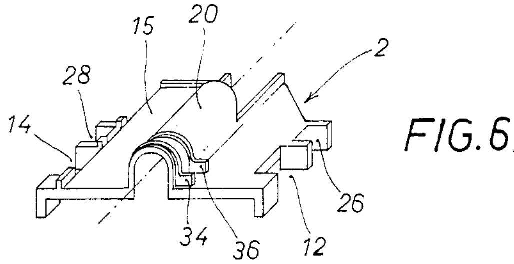
FIG. 6 illustrates, in a perspective view, a support for the printed circuit.

As shown in FIG. 6, a pair of recesses 12 and 14 made in the support 2 constitute an interlocking seat for as many corresponding projections 16 and 18 arranged in the fixed standard 4.

A saddle 20 arranged along the center line of the support 2 permits the passage of a spring 22 acting resiliently between the fixed standard 4 and an assembly of movable contacts 24 of the relay 10.

A further pair of recesses 26 and 28 arranged forwardly of the recesses 12 and 14 in the support 12 constitute seat and guide elements for the passage of a pair of conductor wires 30, 32 for feeding the printed circuit 6.

A pair of projections 34 and 36 arranged parallel to each other and following the outer profile of the saddle 20 define a guide for the passage of the conductor 32 for feeding the signaling device. The printed circuit 6 is accommodated on a plane surface 15 of the support 2 and adhesively connected thereto.

FIGS. 2 and 3 show the printed circuit 6 and the equivalent electric circuit, respectively; for greater clearness the latter has been connected to a coil 40 generating the magnetic field of the relay 10.

The printed circuit 6 shown in FIG. 2 comprises a base 38 of insulating material, a LED 44 and a resistor 46 connected in series to the LED 44. The latter two components constitute the light signaling assembly when the relay is energized.

The resistor 46 is made by depositing on the printed circuit 6 a light layer of highly resistant material and subsequently dimensioning it according to methods known to those skilled in the art to obtain the exact value of resistance required for efficient operation of the LED 44.

The ohm value of the resistor 46 depends exclusively on the voltage value by which the coil 40 is fed; obviously a greater feed voltage corresponds to a greater resistance and vice versa.

The components of the printed circuit 6 are connected to one another by thin conductor paths 48 obtained by photoengraving or other analogous methods known to those skilled in the art.

A pair of short lengths of conductor wires 30 and 32, as described previously, are connected to the poles 54 and 56 of the coil 40 for feeding the printed circuit 6 and its components.

A cover 58 shown in FIG. 1 covers and protects the electromagnetic relay 10 while a push button 60, movable horizontally in the cover 58, permits manual actuation of the relay.

Figure 4:
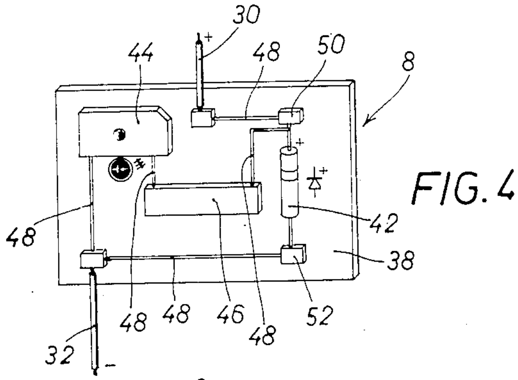
FIG. 4 is a perspective view of the printed circuit according to a variation of the embodiment of FIG. 3, i.e. a printed circuit adapted to be used in a relay fed by direct current.

Referring to FIGS. 4 and 5 there is shown another embodiment of the signaling device for electromagnetic relays according to the invention.

In addition to the printed circuit indicated by the numeral 8 in FIG. 4, this embodiment comprises a silicon diode 42 secured by welding between junctions 50, 52 arranged on the printed circuit 8, the previous components, i.e. base 38, resistor 46 and LED 44, being maintained unchanged.

This latter embodiment is designed to permit the light signaling device to be used also for electromagnetic relays fed by direct current, as with this type of feed overvoltages are produced in the phase of interruption of feed to the coil, a phenomenon known to those skilled in the art.

The silicon diode 42 connected in parallel to the coil 40 thus limits the extent of such overvoltages and in this manner protects any semiconductors (not shown) that may be used as control elements for the electromagnetic relay 10.

It is thus evident that the invention provides a light signaling device that is of extremely contained dimensions and can be equally well inserted in relays fed by alternating current or, by adopting a simple variation as described above, in relays fed by direct current without modifying the dimensions of the printed circuit and, which is of considerable advantage, the described signaling device can be used in standard relays, i.e. relays that have not been constructed on purpose or adapted to the present and current production.

Another advantage of the present invention consists in that the LED has an almost unlimited service life in comparison with a substantially short service life of an incandescent lamp and that it possesses a relatively concentrated brightness converging toward its top and thus presents a considerable individuality to the view of an observer.

Obviuosly the invention is not limited to the described and illustrated embodiments and numerous changes and modifications obvious to one skilled in the art may be made therein without departing from the scope of the invention as defined by the appended claims.

I claim:

1. An electromagnetic relay provided with a light signaling device, said relay having a coil of attraction having poles, said relay further comprising a printed circuit, a base for the printed circuit and a support of heat molded plastic material having a plane surface to receive the base; means for attaching said base for a printed circuit to the plane surface; said printed circuit comprising conductor paths, a LED and a resistor connected in series together and to said conductor paths, and a pair of conductors connecting the printed circuit in parallel to the poles of the coil of attraction of said electromagnetic relay.

2. An electromagnetic relay provided with a light signaling device as claimed in claim 1, further including a silicon diode connected to said conductor paths.

3. An electromagnetic relay provided with a light signaling device as claimed in claim 2, wherein said silicon diode is secured by welding between a pair of junctions of said printed circuit.

4. An electromagnetic relay provided with a light signaling device as claimed in claim 1, wherein said support is secured to a fixed standard of said relay by means of a pair of projections of said standard, said projections being interlockingly inserted in a pair of corresponding first recesses of said support.

5. An electromagnetic relay provided with a light signaling device as claimed in claim 4, wherein a seat for the passage of said conductors is formed in said support by a second pair of recesses arranged forwardly of said recesses of said support.

6. An electromagnetic relay provided with a light signaling device as claimed in claim 1, wherein one of said pair of feed conductors is accommodated in a guide formed by a pair of projections following the profile of a saddle of said support.

7. An electromagnetic relay provided with a light signaling device as claimed in claim 1, wherein said printed circuit is connected to a plane surface of said support by adhesive.

8. An electromagnetic relay provided with a light signaling device as claimed in claim 1, wherein said resistor is formed by a thin layer of resistant material deposited directly on said printed circuit.

* * * * *